(12) United States Patent
Liu et al.

(10) Patent No.: US 11,651,965 B2
(45) Date of Patent: May 16, 2023

(54) METHOD AND SYSTEM FOR CAPPING OF CORES FOR SELF-ALIGNED MULTIPLE PATTERNING

(71) Applicant: Tokyo Electron Limited, Tokyo (JP)

(72) Inventors: Eric Chih-Fang Liu, Albany, NY (US); Akiteru Ko, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 302 days.

(21) Appl. No.: 16/988,170

(22) Filed: Aug. 7, 2020

(65) Prior Publication Data

US 2021/0050214 A1 Feb. 18, 2021

Related U.S. Application Data

(60) Provisional application No. 62/885,524, filed on Aug. 12, 2019.

(51) Int. Cl.
*H01L 21/033* (2006.01)

(52) U.S. Cl.
CPC ...... *H01L 21/0338* (2013.01); *H01L 21/0335* (2013.01); *H01L 21/0337* (2013.01)

(58) Field of Classification Search
CPC ............. H01L 21/0332; H01L 21/0335; H01L 21/0337; H01L 21/0338
See application file for complete search history.

(56) References Cited

U.S. PATENT DOCUMENTS

2009/0246961 A1  10/2009  Heo
2011/0021010 A1  1/2011  Cheng et al.
2017/0278870 A1* 9/2017  Cheng ............... H01L 21/32105
2018/0047583 A1  2/2018  Hautala
2019/0206725 A1  7/2019  Chu et al.
2020/0243665 A1* 7/2020  Ching ............... H01L 29/42392

FOREIGN PATENT DOCUMENTS

KR  1020110123519 A  11/2011

OTHER PUBLICATIONS

Korean Intellectual Property Office, The International Search Report and the Written Opinion for International application No. PCT/US2020/045445, dated Nov. 19, 2020, 12 pg.

* cited by examiner

*Primary Examiner* — Walter H Swanson (57) ABSTRACT

Embodiments are described herein that apply capping layers to cores prior to spacer formation in self-aligned multiple patterning (SAMP) processes to achieve vertical spacer profiles. For one embodiment, a plasma process is used to deposit a capping layer on cores, and this capping layer causes resulting core profiles to have protective caps. These protective caps formed with the additional capping layer help to reduce or minimize material loss and corner loss of the core material during spacer deposition and spacer etch processes. This reduction in core material loss improves the resulting spacer profile so that a more vertical profile is achieved. For one embodiment, an angle of 80-90 degrees is achieved for vertical sidewalls of the spacers adjacent core sites with respect to the horizontal surface of the underlying layer, such as a hard mask layer formed on a substrate for a microelectronic workpiece.

20 Claims, 5 Drawing Sheets

METHOD AND SYSTEM FOR CAPPING OF CORES FOR SELF-ALIGNED MULTIPLE PATTERNING

RELATED APPLICATIONS

This application claims priority to the following provisional application: U.S. Provisional Patent Application Ser. No. 62/885,524, filed Aug. 12, 2019, and entitled "METHOD AND SYSTEM FOR CAPPING OF CORES FOR SELF-ALIGNED MULTIPLE PATTERNING," which is hereby incorporated by reference in its entirety.

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, process flows are being requested to reduce feature size while maintaining structure integrity for various patterning processes.

Self-aligned multiple patterning (SAMP) processes, such as self-aligned double patterning (SADP) processes and self-aligned quadruple patterning (SAQP), have been developed to reduce feature sizes beyond what is directly achievable by lithography processes. For some SAMP processes, spacers are formed as sidewall structures adjacent cores on a substrate being processed, and the core material is later removed using an etch process to leave the spacers. The resulting spacers are then used to transfer patterns to underlying layers. Due to the ability to achieve reduced feature sizes, SAMP processes have been widely adapted for use in a variety of processes including sub-22 nanometer (nm) processes used to form fin-field-effect-transistor (FinFET) devices. In part, these SAMP processes for FinFET structure formation use an extra spacer etch step to achieve pitch reduction for resulting FinFET devices. Because the resulting spacer profiles have a significant impact on pattern transfer to underlying layers as well as the final performance of the devices being formed in these SAMP processes, a vertical spacer profile rather than an angled spacer profile is preferred for spacer sidewalls in order to minimize pattern variation in resulting structures. Because cores are used to form spacers in SAMP processes, the core profiles influence the resulting spacer profile.

FIGS. 1A-1D (Prior Art) provide an example embodiment for a prior SAMP process solution where cores 106 are used to form spacers 142 and then are subsequently pulled using an etch process. The loss of core material from the cores 106 and the corners 124 of the cores 106 during the spacer layer deposition and spacer etch processes leads to angled spacer profiles that can cause increased pattern variation in subsequent pattern transfer steps for SAMP processes and degradation in resulting devices such as FinFET devices.

Figure 1A:
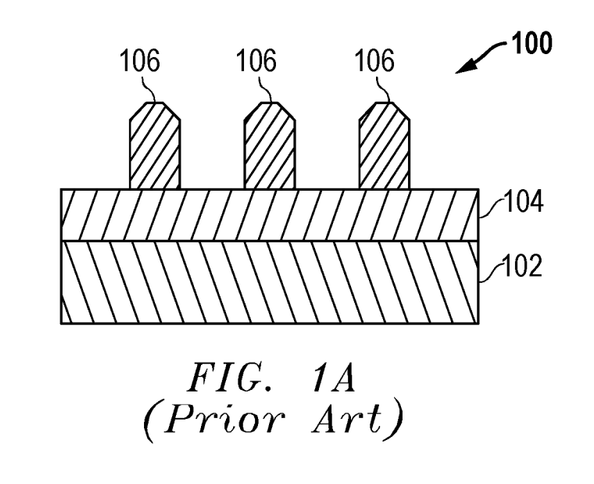
FIGS. 1A-1D (Prior Art) provide an example embodiment for a prior SAMP process solution where cores are used to form spacers and then subsequently pulled using an etch process, but spacers are left with a significant inward lean towards core sites.

FIG. 1A (Prior Art) is a cross-section diagram of an example embodiment 100 for a patterned structure after a core formation process has been performed. For the example embodiment shown, the cores 106 have been formed on underlying layers. These underlying layers can include, for example, a hard mask (HM) layer 104 that has been formed on a substrate 102 for a microelectronic workpiece, although different or additional underlying layers could also be provided. The core formation process can be implemented, for example, using a plasma deposition process.

Figure 1B:
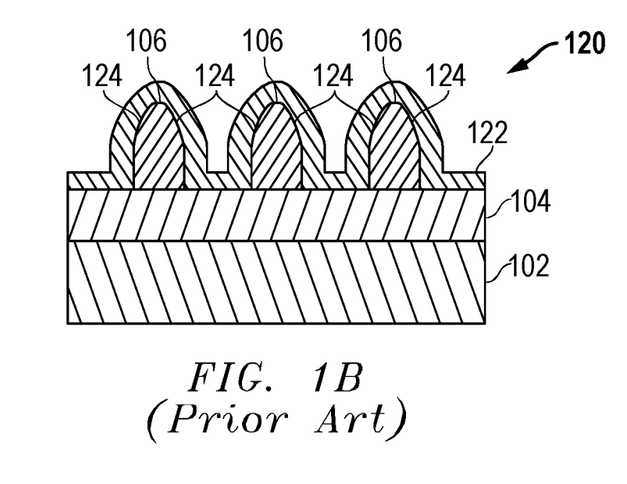

FIG. 1B (Prior Art) is a cross-section diagram of an example embodiment 120 after a spacer deposition process has been performed to deposit a spacer layer 122 over the cores 106 of FIG. 1A (Prior Art). For typical spacer deposition processes, portions of the material for the cores 106 will be lost at the corners 124 for the cores 106 during the formation of the spacer layer 122. The formation of the spacer layer 122 can be implemented, for example, using a plasma deposition process.

Figure 1C:
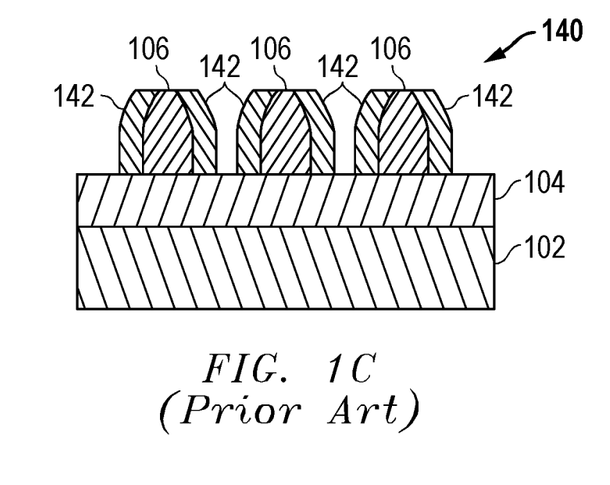

FIG. 1C (Prior Art) is a cross-section diagram of an example embodiment 140 after a spacer etch process has been performed to remove a portion of the spacer layer 122 shown in FIG. 1B (Prior Art) and to leave spacers 142 adjacent the cores 106. The spacer etch process also exposes the cores 106. This spacer etch process may be implemented, for example, using a plasma etch process.

Figure 1D:
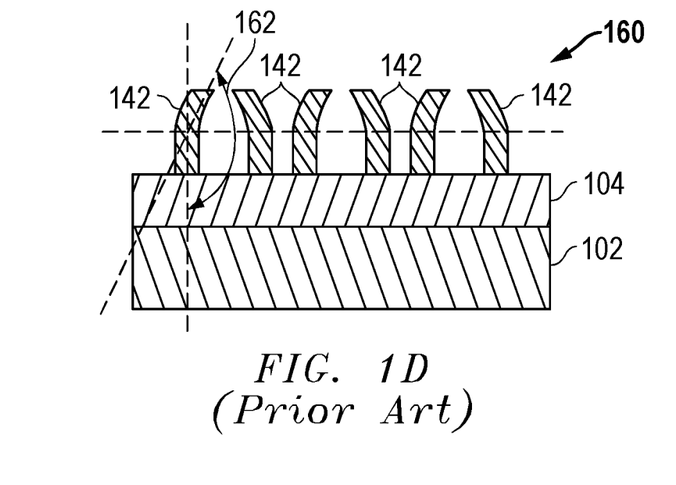

FIG. 1D (Prior Art) is a cross-section diagram of an example embodiment 160 after a core pull process has been performed. This core pull process removes the cores 106 from between the spacers 142 and leaves the spacers 142. The core pull process can be implemented, for example, using a plasma etch process.

One undesired result after the spacer etch and core pull processes can be an inward lean of the spacers 142 towards of the site of the removed cores 106. This inward lean can be caused in part by damage to the cores 106 during spacer deposition and etch processes that result in loss of core material from the cores 106 and the corners 124 of the cores 106 as described above. For one example, as shown in the representative example embodiment 160 in FIG. 1D (Prior Art), the angle 162 of vertical sidewalls for the spacers 142 has a significant inward lean of about 75-76 degrees or less with respect to the horizontal surface of the underlying layer, such as the HM layer 104. It is noted that the angle 162 is represented by a line fit with respect to the leaning top portion of the spacers 142 and a horizontal line parallel to the primary surface of the underlying layer, such as the HM layer 104. This inward lean or taper for the resulting spacer profile rather than a more vertical profile degrades later pattern transfer to underlying layers during subsequent SAMP process steps and increases pattern variation that can cause degradation in performance of devices formed on the microelectronic workpiece.

SUMMARY

Embodiments are described herein that apply capping layers to cores prior to spacer formation in SAMP processes to achieve vertical spacer profiles. For one embodiment, a plasma process is used to deposit a capping layer on cores, and this capping layer causes resulting core profiles to have protective caps. These protective caps formed with the additional capping layer help to reduce or minimize material loss and corner loss of the core material during spacer deposition and spacer etch processes. This reduction in core material loss improves the resulting spacer profile so that a more vertical profile is achieved. For one embodiment, a target angle of 80-90 degrees is achieved for vertical sidewalls of the spacers adjacent core sites with respect to the horizontal surface of the underlying layer, such as a hard mask layer formed on a substrate for a microelectronic workpiece. Different or additional features, variations, and embodiments can also be implemented, and related systems and methods can be utilized as well.

For one embodiment, a method is disclosed for a self-aligned multiple patterning (SAMP) process including forming cores over one or more underlying layers on a substrate of a microelectronic workpiece, forming a capping layer over the cores, forming a spacer layer over the capping layer and the cores, etching the spacer layer to leave spacers adjacent the cores, and removing the cores to leave the spacers.

In additional embodiments, a target angle is achieved for vertical sidewalls for the spacers with respect to a horizontal surface for an underlying layer. In further embodiments, the target angle is between 80 to 90 degrees. In further embodiments, the underlying layer is a hard mask layer.

In additional embodiments, the capping layer includes a protective cap formed over a top portion of the cores. In further embodiments, the capping layer and the cores include a same material. In other embodiments, the capping layer and the cores include different materials.

In additional embodiments, a target height is achieved for the spacers. In further embodiments, the target height represents an increase in spacer height of 5 to 20 percent as compared to a SAMP process that does not form a capping layer. In further additional embodiments, the forming the capping layer is performed using a plasma process.

In additional embodiments, the method includes using the spacers to perform a pattern transfer to one or more underlying layers as part of the SAMP process. In further embodiments, process parameters are controlled for the forming, etching, and removing to achieve a target pattern variation parameter in the pattern transfer.

In additional embodiments, the forming of the spacer layer is performed using a conformal deposition process.

For one embodiment, a method for a self-aligned multiple patterning (SAMP) process is disclosed including forming cores over a hard mask layer formed on a substrate of a microelectronic workpiece, forming protective caps over the cores, depositing a conformal spacer layer over the protective caps and the cores, etching the conformal spacer layer to leave spacers adjacent the cores, and removing the cores to leave the spacers.

In additional embodiments, a target angle is achieved for vertical sidewalls for the spacers with respect to a horizontal surface for an underlying layer. In further embodiments, the target angle is between 80 to 90 degrees. In further embodiments, a target height is achieved for the spacers, and the target height represents an increase in spacer height of 5 to 20 percent as compared to a SAMP process that does not form a capping layer. In additional embodiments, the forming the protective caps is performed using a plasma process.

In additional embodiments, the method includes using the spacers to perform a pattern transfer to one or more underlying layers as part of the SAMP process. In further embodiments, process parameters are controlled for the forming, etching, and removing to achieve a target pattern variation parameter in the pattern transfer.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

As described herein, methods and system are disclosed to apply capping layers to cores prior to spacer formation in self-aligned multiple patterning (SAMP) processes to achieve improved vertical spacer profiles. A variety of advantages and implementations can be achieved while taking advantage of the process techniques described herein.

As described above for conventional SAMP processes, spacer layers are deposited onto cores that have been formed over underlying layers. During this deposition process and following etch processes, resulting spacers lean inward towards the core sites by a significant amount due to loss of core material and spacer bending effects.

For the embodiments described herein, an additional process step is performed to add a capping layer on the cores prior to spacer layer formation to reduce or prevent this core material loss and thereby improve the resulting spacer profile. By adding this capping layer step, a more vertical angle is achieved for vertical sidewalls of spacers as compared to prior SAMP processes. Further, increased spacer height is also achieved as compared to prior SAMP processes. The more vertical profiles for the resulting spacers provide improved results in later pattern transfer to underlying layers during subsequent SAMP process steps. Further, process parameters can be controlled for capping layer formation, spacer layer formation, spacer layer etch, core removal, and/or other process steps to achieve target pattern variation parameters in the subsequent pattern transfer.

FIGS. 2A-2E provide an example embodiment for a SAMP process solution where a capping layer 222 is applied to cores 106 prior to spacer formation in order to improve vertical sidewall profiles for resulting spacers 262. As described below, the processing starts with the conventional SAMP process for core formation. After the core formation, a new process step to add a capping layer 222 is applied as compared to prior solutions. This capping layer 222, for example, can be formed using one or more plasma processes. For one embodiment, the process conditions for this capping layer method, such as a plasma capping process, are controlled to form a helmet-like cap on top of the core material for the cores 106. The capping layer 222 can be the same material or a different material as the core material. After formation of the capping layer 222 over the cores 106, a spacer deposition process is then performed to form a spacer layer 242 over the capped cores 106. For example, the spacer deposition process can be a conformal deposition process that wraps the spacer layer 242 as a conformal layer over the cores 106 and the capping layer 222. Spacer etch and core pull processes are then performed to leave spacers 262. Because the capping layer 222 works as a helmet or protective cap on top portions of the cores 106, damage and corner loss to the cores 106 during the spacer deposition and etch is reduced or minimized. Where the capping layer material is different from the core material, different or additional core pull processes and related process conditions can be used as compared to prior SAMP processes. Further, due to the capping material, extension of the etch time can also be applied to remove the cores 106 and the caps formed by the capping layer 222. Other variations can also be implemented.

As described herein, the capping layer 222 helps to reduce or prevent loss of core material and thereby reduces or prevents profile leaning of the resulting spacers 262. Therefore, the final spacer profile is more vertical as compared with prior solutions, and higher spacer heights are also achieved as compared with prior solutions. The more vertical spacers significantly reduce pattern variations and improve resulting process parameters such as line roughness performance. The increased spacer height, which can also achieved, provides more mask budget for subsequent pattern transfers to underlying layers. Additional advantages can also be achieved, and additional variations can be implemented while still taking advantage of the core capping techniques described herein.

Figure 2A:
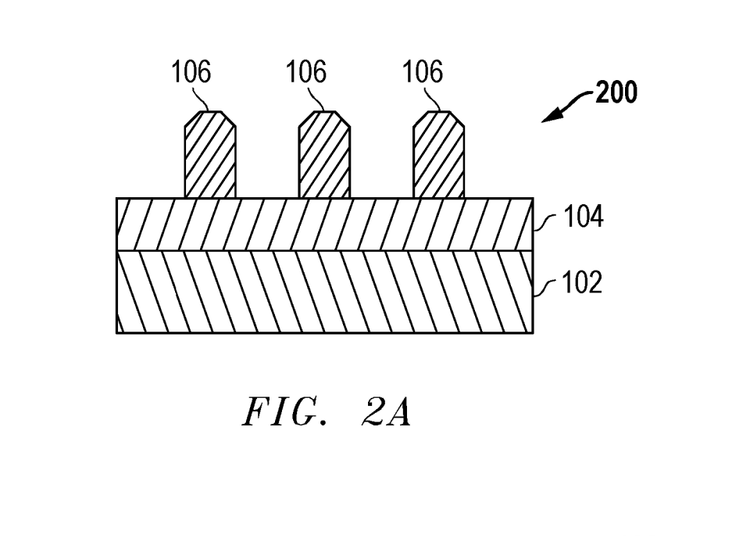
FIGS. 2A-2E provide an example embodiment for a SAMP process solution where a capping layer is applied to cores prior to spacer formation in order to improve vertical sidewall profiles for resulting spacers.

Now looking to FIG. 2A, a cross-section diagram is of an example embodiment 200 for a patterned structure after a core formation process has been performed. For the example embodiment shown, the cores 106 have been formed on underlying layers. These underlying layers can include, for example, a hard mask (HM) layer 104 that has been formed on a substrate 102 for a microelectronic workpiece, although different or additional underlying layers could also be provided. The core formation process can be implemented, for example, using a plasma deposition process. FIG. 2A is similar to FIG. 1A (Prior Art).

Figure 2B:
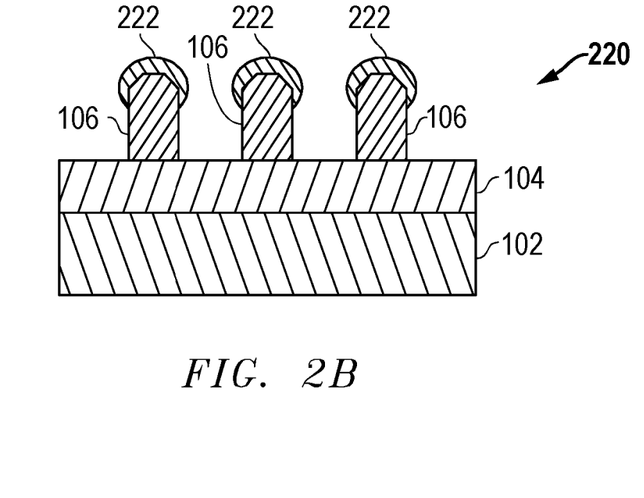

FIG. 2B is a cross-section diagram of an example embodiment 220 after a capping layer process has been performed to form a capping layer 222 over the cores 106. For one embodiment, the capping layer process forms protective caps on top portions of the cores 106 as the capping layer 222. The capping layer process can be implemented, for example, using a plasma process although other processes could also be used. In contrast with prior solutions as shown in FIG. 1B (Prior Art), the capping layer 222 protects the cores 106 during subsequent spacer layer formation and spacer etch processes to achieve more vertical spacer profiles.

Figure 2C:
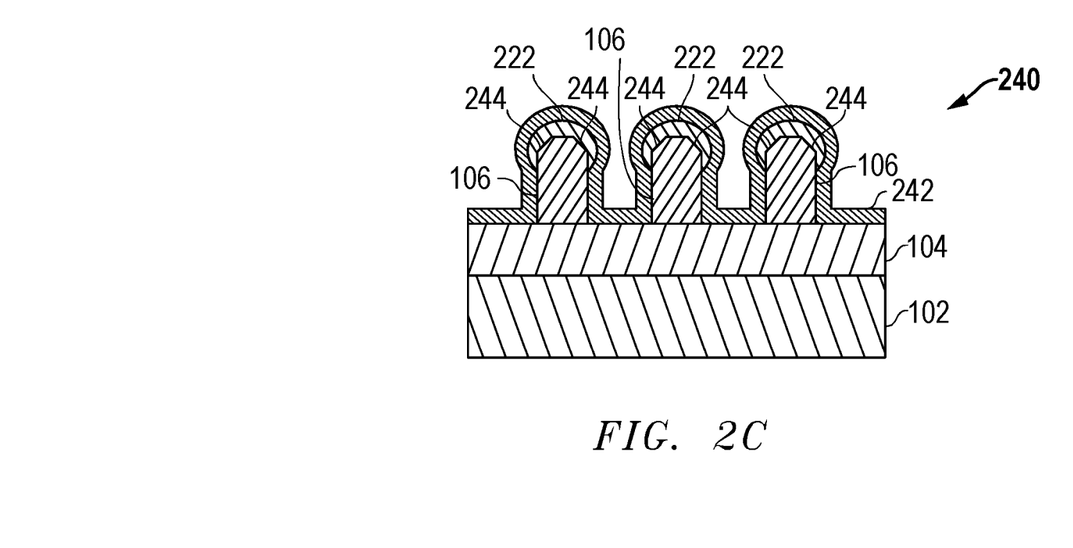

FIG. 2C is a cross-section diagram of an example embodiment 240 after a spacer deposition process has been performed to deposit a spacer layer 242 over the capping layer 222 and cores 106 of FIG. 2B. As shown, the capping layer 222 on the cores 106 causes a change in the profile of the spacer layer 242 as it covers the capping layer 222 and the cores 106. Further, the corners 244 for the cores 106 are protected by the capping layer 222. As such, in contrast with the corners 124 shown in FIG. 1B (Prior Art), loss of core material for the cores 106 at the corners 244 is reduced or eliminated during the spacer deposition process. The spacer deposition process can be, for example, a conformal deposition process. Further, the spacer deposition process can be implemented using a plasma deposition process.

Figure 2D:
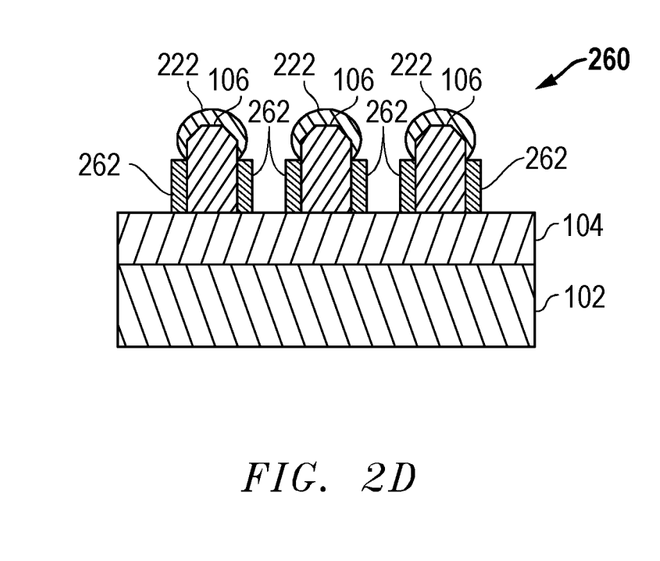

FIG. 2D is a cross-section diagram of an example embodiment 260 after a spacer etch process has been performed. The spacer etch process removes a portion of the spacer layer 242 and leaves spacers 262 adjacent the cores 106. The spacer etch process also exposes the capping layer 222. Depending upon how much the spacer etch process etches the spacer layer 242, the spacer etch process can also expose a portion of the sidewall of the cores 106 above the spacer 262. The spacer etch processes can be implemented, for example, as plasma etch processes.

Figure 2E:
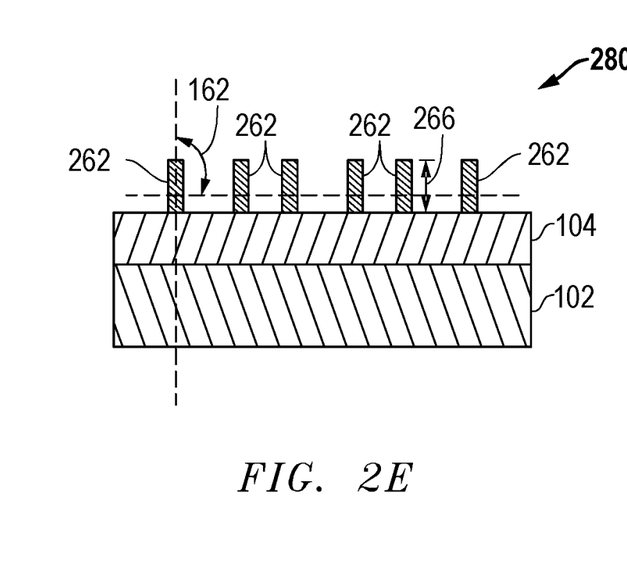

FIG. 2E is a cross-section diagram of an example embodiment 280 after a core pull process have been performed. This core pull process removes capping layer 222 and removes the cores 106 from between the spacers 106 to leave the spacers 262. Where the same material is used for the capping layer 222 and the cores 106, a single etch process can be used as the core pull process to remove the capping layer 222 and the cores 106. Where different materials are used, additional and/or different etch processes can be implemented to remove the capping layer 222 and the spacer layer 242. The core pull process can be implemented, for example, using one or more plasma etch processes. As seen in FIG. 2E, the spacer profiles are more vertical than the spacer profiles in the prior solution of FIG. 1D (Prior Art).

By adding the capping layer process as described herein, the material for the cores 106 and the core corners 244 is protected during subsequent spacer deposition and etch processes. This reduction or minimizing of loss of core material results in profiles for the resulting spacers 262 that are more vertical as compared to prior solutions. For one embodiment, a target angle 162 between 80-90 degrees (e.g., 80 degrees≤angle 162≤90 degrees) is achieved for vertical sidewalls of the spacers 262 adjacent core sites with respect to the horizontal surface of an underlying layer. It is noted that for the example embodiment 280 in FIG. 2E, the angle 162 is shown to be 90 degrees so that the line fit to the spacers 262 is perpendicular with respect to a horizontal line parallel to the primary surface of the underlying layer. As shown in FIGS. 2A-2E, the underlying layer can be a hard mask layer 104 formed on a substrate 102 for a microelectronic workpiece, although the cores 106 can be formed on one or more other types of layers. In addition to more vertical spacer profiles, increased spacer height 266 is also achieved by adding the capping layer process, such as a plasma capping process, as compared to prior solutions without the capping layer process. For one embodiment, a target height is achieved for the spacer height by adding the capping layer process. For one further embodiment, this target height represents an increase in spacer height of 5 to 20 percent as compared to prior solutions that do not use the capping layer process. Other advantages can also be achieved while still using the techniques described herein.

Figure 3A:
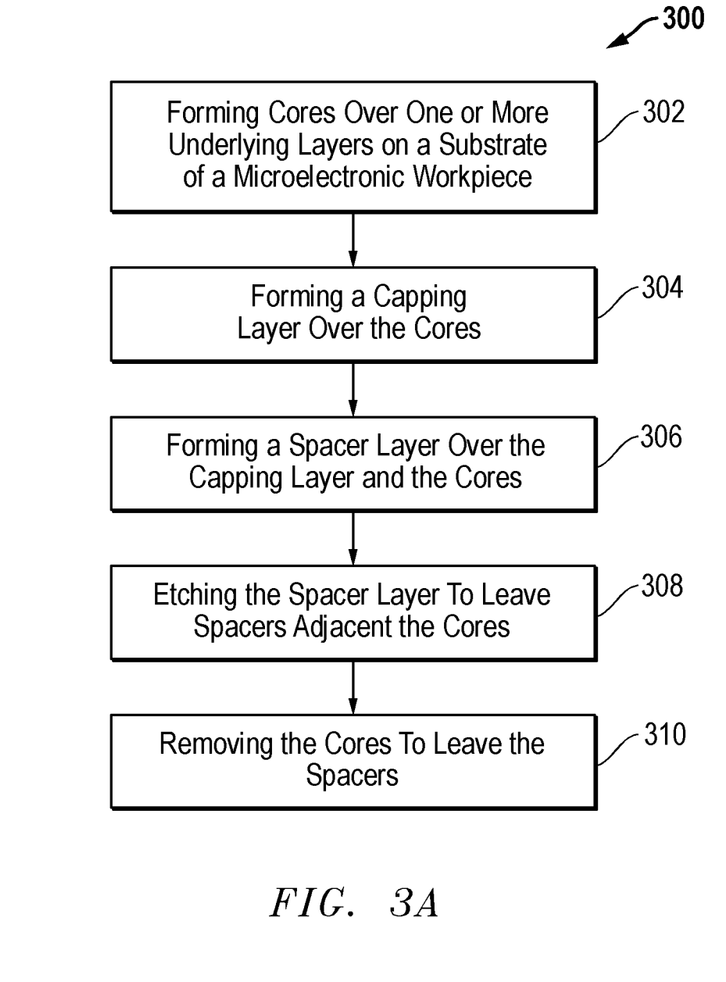
FIG. 3A-3B provide process flow diagrams of example embodiments for SAMP processes where a capping layer is applied to cores prior to spacer formation in order to improve vertical sidewall profiles for resulting spacers.

FIG. 3A is a process flow diagram of an example embodiment 300 for a SAMP process where a capping layer is applied to cores prior to spacer formation in order to improve vertical sidewall profiles for resulting spacers. In block 302, cores are formed over one or more underlying layers on a substrate of a microelectronic workpiece. In block 304, a capping layer is formed over the cores. In block 306, a spacer layer is formed over the capping layer and the cores. In block 308, the spacer layer is etched to leave spacers adjacent the cores. In block 310, the cores are removed to leave the spacers. It is noted that additional and/or different process steps could also be implemented while still taking advantage of the techniques described herein.

Figure 3B:
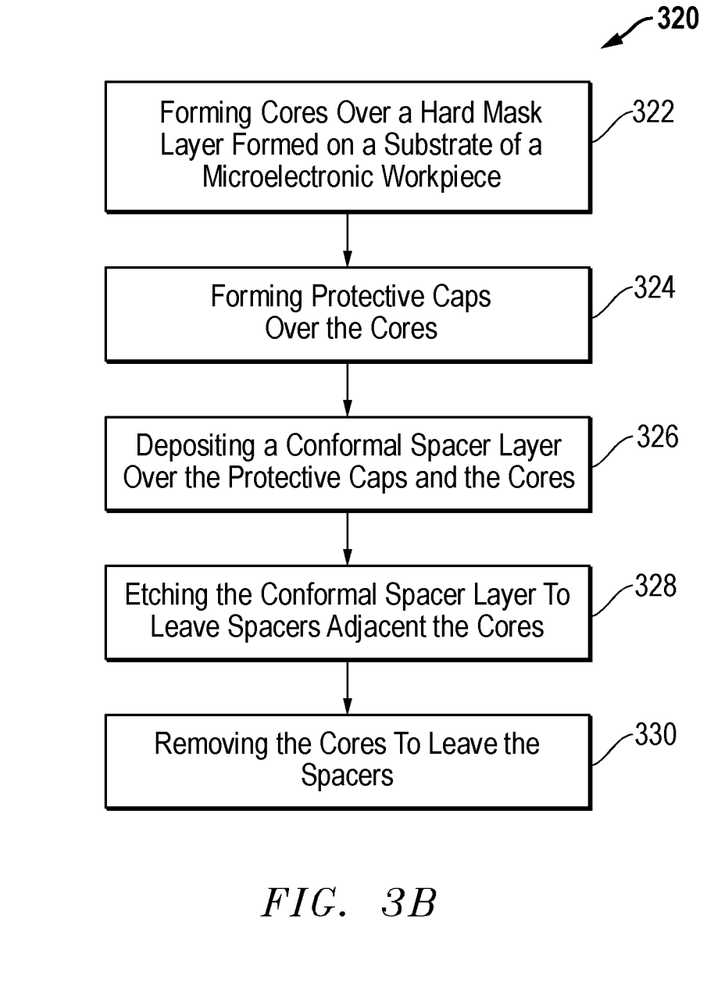

FIG. 3B is a process flow diagram of an example embodiment 320 for a SAMP process where protective caps are formed over cores prior to spacer formation in order to improve vertical sidewall profiles for resulting spacers. In block 322, cores are formed over a hard mask layer formed on a substrate of a microelectronic workpiece. In block 324, protective caps are formed over the cores. In block 326, a conformal spacer layer is deposited over the protective caps and the cores. In block 328, the conformal spacer layer is etched to leave spacers adjacent the cores. In block 330, the cores are removed to leave the spacers. It is noted that additional and/or different process steps could also be implemented while still taking advantage of the techniques described herein.

It is further noted that the techniques described herein may be utilized with a wide range of processing systems including plasma processing systems. For example, the techniques may be utilized with plasma etch process systems, plasma deposition process systems, or any other plasma process system.

Figure 4:
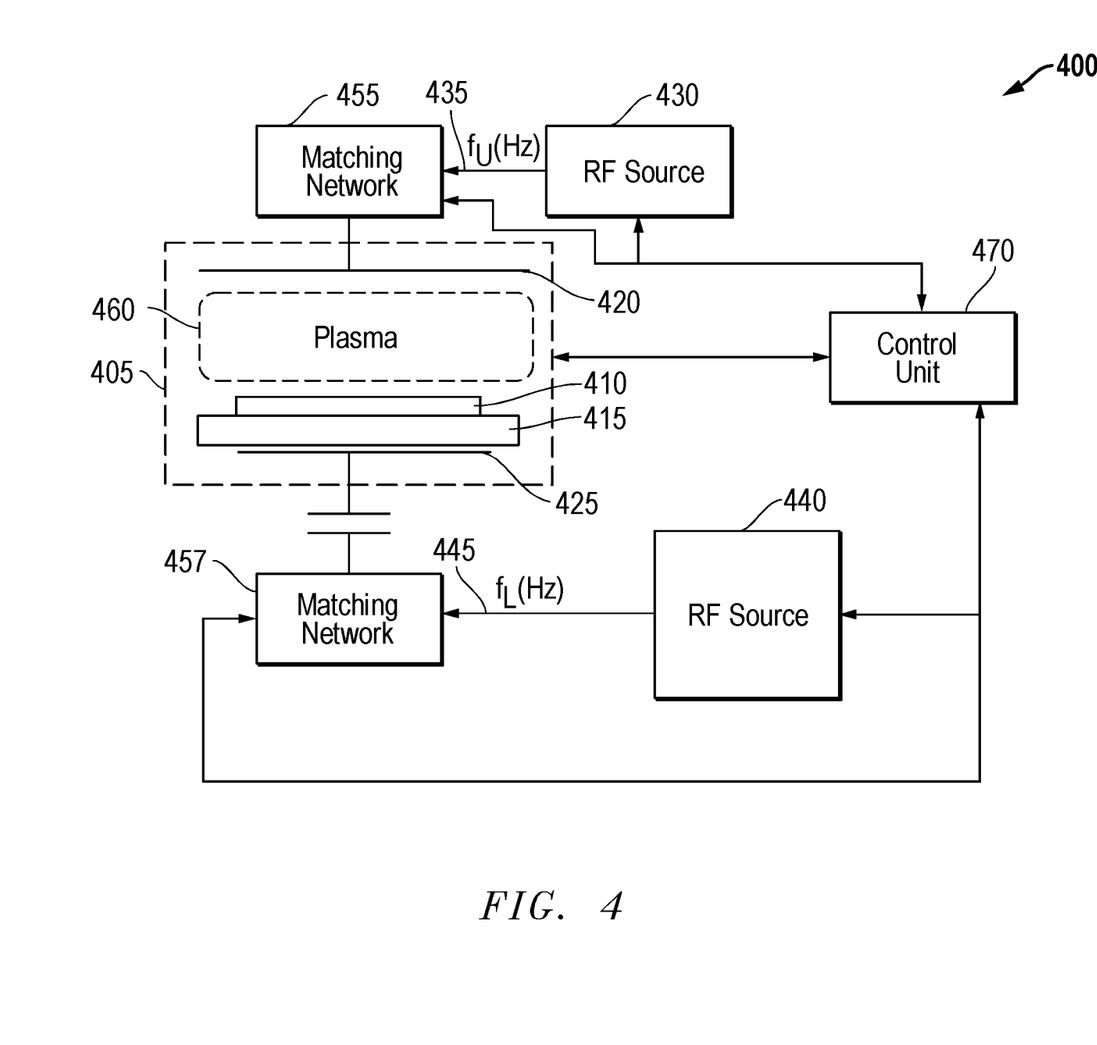
FIG. 4 provides one example embodiment for a plasma processing system that can be used with respect to the disclosed techniques and is provided only for illustrative purposes.

FIG. 4 provides one example embodiment for a plasma processing system 400 that can be used with respect to the disclosed techniques and is provided only for illustrative purposes. The plasma processing system 400 may be a capacitively coupled plasma processing apparatus, inductively coupled plasma processing apparatus, microwave plasma processing apparatus, Radial Line Slot Antenna (RLSA™) microwave plasma processing apparatus, electron cyclotron resonance (ECR) plasma processing apparatus, or other type of processing system or combination of systems. Thus, it will be recognized by those skilled in the art that the techniques described herein may be utilized with any of a wide variety of plasma processing systems. The plasma processing system 400 can be used for a wide variety of operations including, but not limited to, etching, deposition, cleaning, plasma polymerization, plasma-enhanced chemical vapor deposition (PECVD), atomic layer deposition (ALD), atomic layer etch (ALE), and so forth. The structure of a plasma processing system 400 is well known, and the particular structure provided herein is merely of illustrative purposes. It will be recognized that different and/or additional plasma process systems may be implemented while still taking advantage of the techniques described herein.

Looking in more detail to FIG. 4, the plasma processing system 400 may include a process chamber 405. As is known in the art, process chamber 405 may be a pressure-controlled chamber. A substrate 410 (in one example a semiconductor wafer) may be held on a stage or chuck 415. An upper electrode 420 and a lower electrode 425 may be provided as shown. The upper electrode 420 may be electrically coupled to an upper radio frequency (RF) source 430 through an upper matching network 455. The upper RF source 430 may provide an upper frequency voltage 435 at an upper frequency ($f_U$). The lower electrode 425 may be electrically coupled to a lower RF source 440 through a lower matching network 457. The lower RF source 440 may provide a lower frequency voltage 445 at a lower frequency ($f_L$). Though not shown, it will be known by those skilled in the art that a voltage may also be applied to the chuck 415.

Components of the plasma processing system 400 can be connected to, and controlled by, a control unit 470 that in turn can be connected to a corresponding memory storage unit and user interface (all not shown). Various plasma-processing operations can be executed via the user interface, and various plasma processing recipes and operations can be stored in a storage unit. Accordingly, a given substrate can be processed within the plasma-processing chamber with various microfabrication techniques. It will be recognized that since control unit 470 may be coupled to various components of the plasma processing system 400 to receive inputs from and provide outputs to the components.

The control unit 470 can be implemented in a wide variety of manners. For example, the control unit 470 may be a computer. In another example, the control unit includes one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In operation, the plasma processing apparatus uses the upper and lower electrodes to generate a plasma 460 in the process chamber 405 when applying power to the system from the upper RF source 430 and the lower RF source 440. Further, as is known in the art, ions generated in the plasma 460 may be attracted to the substrate 410. The generated plasma can be used for processing a target substrate (such as substrate 410 or any material to be processed) in various types of treatments such as, but not limited to, plasma etching, chemical vapor deposition, treatment of semiconductor material, glass material and large panels such as thin-film solar cells, other photovoltaic cells, organic/inorganic plates for flat panel displays, and/or other applications, devices, or systems.

Application of power results in a high-frequency electric field being generated between the upper electrode 420 and the lower electrode 425. Processing gas delivered to process chamber 405 can then be dissociated and converted into a plasma. As shown in FIG. 4, the exemplary system described utilizes both upper and lower RF sources. For example, high-frequency electric power, for an exemplary capacitively coupled plasma system, in a range from about 3 MHz to 150 MHz or above may be applied from the upper RF source 430 and a low frequency electric power in a range from about 0.2 MHz to 40 MHz can be applied from the lower RF source. Different operational ranges can also be used. Further, it will be recognized that the techniques described herein may be utilized with in a variety of other plasma systems. In one example system, the sources may switched (higher frequencies at the lower electrode and lower frequencies at the upper electrode). Further, a dual source system is shown merely as an example system and it will be recognized that the techniques described herein may be utilized with other systems in which a frequency power source is only provided to one electrode, direct current (DC) bias sources are utilized, or other system components are utilized.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, atomic layer etch (ALE), and/or other desired etch processes. For example, plasma etch processes can be implemented using plasma containing fluorocarbons, oxygen, nitrogen, hydrogen, argon, and/or other gases. In addition, operating variables for process steps can be controlled to ensure that target parameters are achieved. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate." as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for a self-aligned multiple patterning (SAMP) process, comprising:
    forming cores over one or more underlying layers on a substrate of a microelectronic workpiece, each core having a non-planar top portion and an exposed bottom portion;
    forming a capping layer over the cores, the capping layer wrapping around the non-planar top portion, leaving the bottom portion exposed;
    forming a spacer layer over the capping layer and the exposed bottom portions of the cores;
    etching the spacer layer to leave spacers adjacent the cores; and
    removing the cores to leave the spacers.

2. The method of claim 1, wherein a target angle is achieved for vertical sidewalls for the spacers with respect to a horizontal surface for an underlying layer.

3. The method of claim 2, wherein the target angle is between 80 to 90 degrees.

4. The method of claim 2, wherein the underlying layer is a hard mask layer.

5. The method of claim 1, wherein the capping layer comprises a protective cap formed over a top portion of the cores.

6. The method of claim 1, wherein the capping layer and the cores comprise a same material.

7. The method of claim 1, wherein the capping layer and the cores comprise different materials.

8. The method of claim 1, wherein a target height is achieved for the spacers.

9. The method of claim 8, wherein the target height represents an increase in spacer height of 5 to 20 percent as compared to a SAMP process that does not form a capping layer.

10. The method of claim 1, wherein the forming the capping layer is performed using a plasma process.

11. The method of claim 1, further comprising using the spacers to perform a pattern transfer to the one or more underlying layers as part of the SAMP process.

12. The method of claim 11, wherein process parameters are controlled for the forming, etching, and removing to achieve a target pattern variation parameter in the pattern transfer.

13. The method of claim 1, wherein the forming of the spacer layer is performed using a conformal deposition process.

14. A method for a self-aligned multiple patterning (SAMP) process, comprising:
forming cores over a hard mask layer formed on a substrate of a microelectronic workpiece, each core having a non-planar top portion and an exposed bottom portion;
forming protective caps over the cores, each protective cap wrapping around the non-planar top portion, leaving the bottom portion exposed;
depositing a conformal spacer layer over the protective caps and the exposed bottom portions of the cores;
etching the conformal spacer layer to leave spacers adjacent the cores; and
removing the cores to leave the spacers.

15. The method of claim 14, wherein a target angle is achieved for vertical sidewalls for the spacers with respect to a horizontal surface for an underlying layer.

16. The method of claim 15, wherein the target angle is between 80 to 90 degrees.

17. The method of claim 14, wherein a target height is achieved for the spacers, the target height representing an increase in spacer height of 5 to 20 percent as compared to a SAMP process that does not form a capping layer.

18. The method of claim 14, wherein the forming the protective caps is performed using a plasma process.

19. The method of claim 14, further comprising using the spacers to perform a pattern transfer to one or more underlying layers as part of the SAMP process.

20. The method of claim 19, wherein process parameters are controlled for the forming, etching, and removing to achieve a target pattern variation parameter in the pattern transfer.

* * * * *